United States Patent
Duarte et al.

(10) Patent No.: US 9,384,601 B2
(45) Date of Patent: Jul. 5, 2016

(54) AIRCRAFT ELECTRONIC FINGERPRINT AND MONITORING PERFORMANCE OF AN AIRCRAFT COMPONENT USING THE AIRCRAFT'S ELECTRONIC FINGERPRINT

(71) Applicant: PPG INDUSTRIES OHIO, INC., Cleveland, OH (US)

(72) Inventors: Nicolas B. Duarte, Belle Vernon, PA (US); Yu Jiao, Blawnox, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 0 days.

(21) Appl. No.: 14/460,408

(22) Filed: Aug. 15, 2014

(65) Prior Publication Data
US 2016/0049021 A1 Feb. 18, 2016

(51) Int. Cl.
| | | |
|---|---|---|
| G01C 23/00 | (2006.01) | |
| G07C 5/08 | (2006.01) | |
| G01M 17/00 | (2006.01) | |
| G01R 31/00 | (2006.01) | |
| B64D 15/12 | (2006.01) | |
| H05B 3/00 | (2006.01) | |

(52) U.S. Cl.
CPC ............ *G07C 5/0808* (2013.01); *G01M 17/00* (2013.01); *G01R 31/008* (2013.01); *G07C 5/08* (2013.01); *G07C 5/085* (2013.01); *G07C 5/0816* (2013.01); *B64D 15/12* (2013.01); *H05B 3/00* (2013.01)

(58) Field of Classification Search
CPC ........... B60R 2325/00; G07C 9/00563; G07C 5/085; B60W 50/029; H02J 17/00
USPC ....... 701/1, 3, 13, 14, 36; 340/568.1
See application file for complete search history.

(56) References Cited

U.S. PATENT DOCUMENTS

| | | | |
|---|---|---|---|
| 3,762,902 A | 10/1973 | Wagner et al. | |
| 4,078,107 A | 3/1978 | Bitterice et al. | |
| 4,610,771 A | 9/1986 | Gillery | |
| 4,623,389 A | 11/1986 | Donley et al. | |
| 4,806,220 A | 2/1989 | Finley | |
| 4,894,513 A | 1/1990 | Koontz | |
| 4,902,875 A | 2/1990 | Koontz | |
| 4,994,650 A | 2/1991 | Koontz | |
| 5,675,944 A | 10/1997 | Kerr et al. | |
| 5,821,001 A | 10/1998 | Arbab et al. | |
| 7,183,895 B2 * | 2/2007 | Bazakos et al. | 340/5.7 |
| 8,155,816 B2 | 4/2012 | Rashid et al. | |
| 8,383,994 B2 | 2/2013 | Rashid et al. | |
| 2001/0056544 A1 * | 12/2001 | Walker | 713/200 |
| 2013/0075531 A1 | 3/2013 | Jiao et al. | |
| 2013/0211737 A1 | 8/2013 | Batcheller et al. | |

FOREIGN PATENT DOCUMENTS

WO   2013102266 A1   7/2013

OTHER PUBLICATIONS

PCT Search Report, PCT/US2015/042869, dated Oct. 12, 2015.

* cited by examiner

*Primary Examiner* — Gertrude Arthur Jeanglaud
(74) *Attorney, Agent, or Firm* — Andrew C. Siminerio

(57) ABSTRACT

An initial electronic fingerprint for a vehicle and selected component of the vehicle, e.g. an aircraft windshield having a heatable member, is made. During operation of the aircraft, the initial electronic fingerprint of the aircraft and a real time electronic fingerprint of the aircraft are compared to determine the operating performance of the heatable member. The parameter that provides the performance of the component includes a time count within a predetermined time period. As the time count increases during the predetermined time period, the performance of the heatable member toward unacceptable performance increases.

22 Claims, 12 Drawing Sheets

AIRCRAFT ELECTRONIC FINGERPRINT AND MONITORING PERFORMANCE OF AN AIRCRAFT COMPONENT USING THE AIRCRAFT'S ELECTRONIC FINGERPRINT

BACKGROUND OF THE INVENTION

1. Field of the Invention

This invention relates to making an aircraft electronic fingerprint, and to monitoring performance of an aircraft component using the aircraft's electronic fingerprint, and more particularly, to making an aircraft's electronic fingerprint, and to a method of, and system for, monitoring the performance of an aircraft component, e.g. but not limited to a heatable window of the aircraft using the aircraft's electronic fingerprint.

2. Presently Available Technology

At the present time, an acceptable practice is to mount a sensor on an aircraft component. e.g. but not limited to an aircraft window, e.g. but not limited to an aircraft windshield, and to monitor the output of the sensor to determine operating performance of the aircraft windshield. When the output of the sensor indicates that the aircraft window is operating outside of acceptable limits, remedial action is taken. For a more detailed discussion, of monitoring performance of a component of the aircraft and taking remedial action, reference is made to U.S. Pat. Nos. 8,155,816 and 8,383,994, and U.S. Published Patent Application 2013/0075531, which documents in their entirety are hereby incorporated by reference.

Although the present technology for monitoring performance of an aircraft component by measuring the output of the sensor is acceptable there are limitations. More particularly, and not limiting to the discussion, one of the limitations of the available technology is that the signal from the sensor includes electronic noise from other electrical components of the aircraft, and the contribution of the electronic noise from other electrical components of the aircraft is not factored into or its contribution not considered when acting on the output of the sensor to measure operating performance of the aircraft component. By way of illustration and not limiting to the discussion, the total electronic signal measured includes electronic noise from other electrical components of the aircraft and the electronic signal from the sensor. These combinations can miss-trigger the sensor indicating that the component being monitored is performing outside of acceptable limits when in fact it is operating within acceptable limits.

As can now be appreciated by those skilled in the art, it would be advantageous to provide a method of, and system for, monitoring the output of the sensor that takes into account the noise contribution to the signal of the sensor by other electronic components of the aircraft.

SUMMARY OF THE INVENTION

This invention relates to a method of making an initial electronic fingerprint for an aircraft having an electric powered article by, among other thing monitoring performance of the article to determine if the article is operating within an acceptable performance range; operating the aircraft under normal flight conditions for a predetermined operating period of time, the aircraft having the article operating within the acceptable performance range during the predetermined operating period of time; monitoring electrical signal of the aircraft during the predetermined operating period of time, the electrical signal comprising the current passing through the aircraft electrical system including passing through the article, and acting on data of the electric signal of the aircraft monitored during the predetermined operating period of time to generate the initial electronic fingerprint for the aircraft, the initial electronic fingerprint comprising a threshold electric set point, a predetermined count time period, and an intercepting time period during the predetermined count time period, the intercepting time period is amount of time curve of the electronic signal of the aircraft overlays the threshold electric set point.

The invention also relates to a method of identifying electronic fingerprint of a vehicle by, among other things, using electronic equipment and methodology to monitor the flow of electric current through the vehicle including through an article of the vehicle to generate data indicating performance of the article under acceptable conditions and indicating performance of the article under operating conditions.

This invention still further relates to a method of monitoring performance of an article mounted in or on a vehicle by, among other things, generating an initial electronic fingerprint of the vehicle having the article, the initial electronic fingerprint includes, among other things, a threshold electric set point, a predetermined count time period, and an intercepting time period during the predetermined count time period, the intercepting time period is amount of time curve of the electronic signal of the aircraft overlays the set point; generating a real time electronic signal of the vehicle, the real time electronic signal comprising the threshold electric set point and the predetermined count time of the initial electronic finger print, and an intercepting time period generated from the data collected after the predetermined operating period of time hereinafter defined as a "second intercepting time period"; comparing the initial electronic fingerprint and the real time electronic signal to determine the difference between the intercepting time period and the second intercepting time period; and acting on the difference between the intercepting time period and the second intercepting time period to determine if the article is operating within or without acceptable limits, wherein the generating an initial electronic fingerprint, the generating a real time electronic signal, the comparing and the acting are performed using electronic equipment.

DETAILED DESCRIPTION OF THE INVENTION

Figure 1:
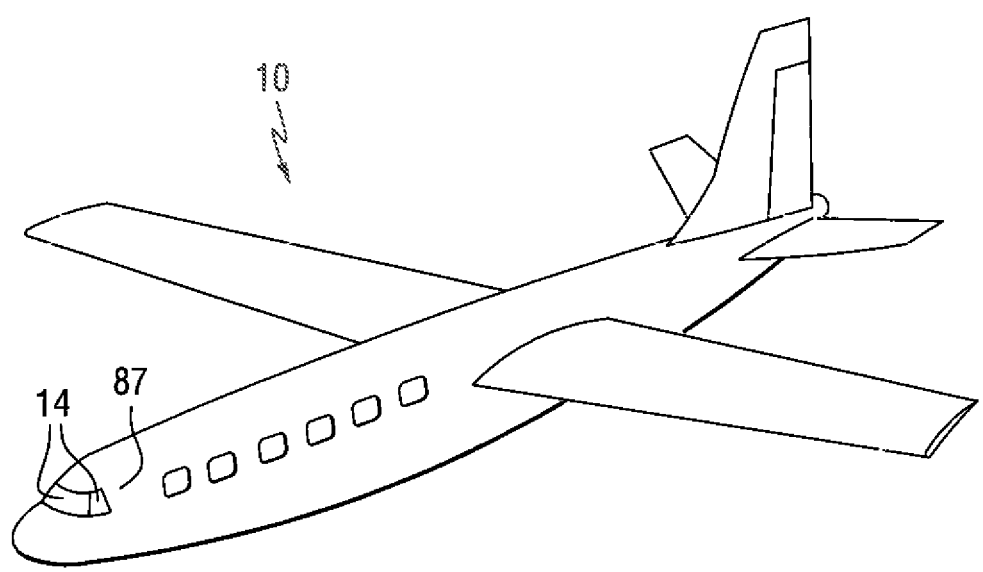
FIG. 1 is an isometric view of prior art aircraft that can be used in the practice of the invention.

As used herein, spatial or directional terms such as "inner", "outer", "left", "right", "up", "down", "horizontal", "vertical", and the like, relate to the invention as it is shown in the drawing on the figures. However, it is to be understood that the invention can assume various alternative orientations and, accordingly, such terms are not to be considered as limiting. Further, all numbers expressing dimensions, physical characteristics, and so forth, used in the specification and claims are to be understood as being modified in all instances by the term "about". Accordingly, unless indicated to the contrary, the numerical values set forth in the following specification and claims can vary depending upon the property desired and/or sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Moreover, all ranges disclosed herein are to be understood to encompass any and all subranges subsumed therein. For example, a stated range of "1 to 10" should be considered to include any and all subranges between and inclusive of the minimum value of 1 and the maximum value of 10; that is, all subranges beginning with a minimum value of 1 or more and ending with a maximum value of 10 or less, e.g., 1 to 6.7, or 3.2 to 8.1, or 5.5 to 10. Also, as used herein, the term "positioned over" or "mounted over" means positioned on or mounted over but not necessarily in surface contact with. For example, one article or component of an article "mounted over" or positioned over another article or component of an article does not preclude the presence of materials between the articles, or between components of the article, respectively. Further, one article or component of an article "mounted on" or positioned on another article or component of an article means that the articles are in surface contact with one another and precludes the presence of materials between the articles, or between components of the article, respectively.

Before discussing non-limiting embodiments of the invention, it is understood that the invention is not limited in its application to the details of the particular non-limiting embodiments shown and discussed herein since the invention is capable of other embodiments. Further, the terminology used herein to discuss the invention is for the purpose of description and is not of limitation. Still further, unless indicated otherwise in the following discussion, like numbers refer to like elements.

A nonlimiting embodiment of the invention will be directed to an aircraft e.g. but not limited to the aircraft 10 shown in FIG. 1; and to the transparencies of the aircraft, e.g. but not limited to aircraft windshields 14. The invention, however, is not limited to any particular type of aircraft and/or aircraft transparency, and the invention can be practiced on any type of aircraft and/or aircraft transparency. Further, the invention can be practiced on commercial and residential windows, e.g. but not limited to the type disclosed in U.S. Pat. No. 5,675,944; a window for any type of land vehicle; a canopy, cabin window and windshield for any type of air and space vehicle, a window for any above or below water vessel, and a window for a viewing side or door for any type of containers, for example but not limited to a refrigerator, cabinet and/or oven door.

Figure 2:
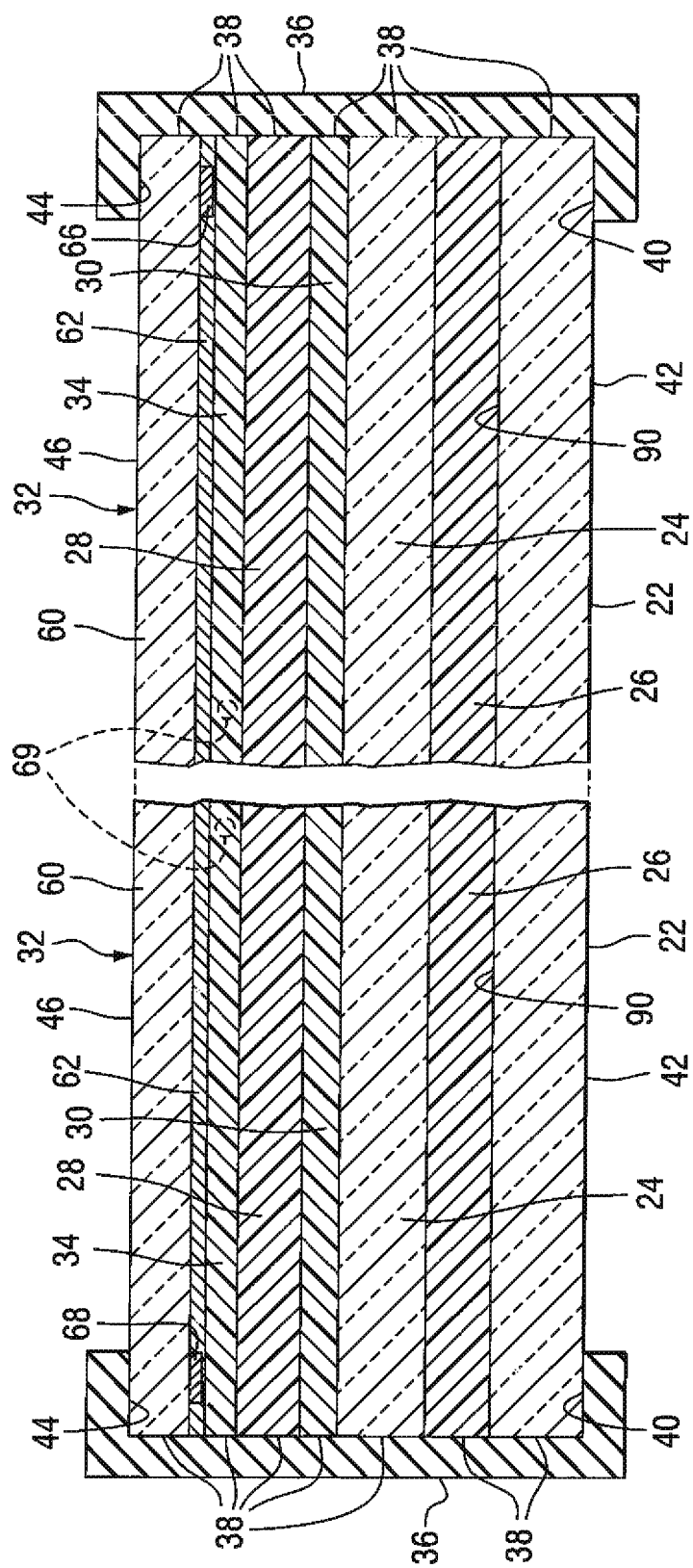
FIG. 2 is a cross sectional view of an aircraft transparency that can be used in the practice of the invention.

The windshields 14 are preferably laminated windshields have sensors, e.g. but not limited to the type of sensors disclosed in U.S. Pat. Nos. 8,155,816 and 8,383,994, and U.S. Published Patent Application 2013/0075531; the entire disclosures of U.S. Pat. Nos. 8,155,816 and 8,383,994, and U.S. Published Patent Application 2013/0075531 are hereby incorporated by reference. Shown in FIG. 2 is a non-limiting embodiment of the cross section of the aircraft windshield 14 that can be used in the practice of the invention. The windshield 14 includes a first glass sheet 22 secured to a second glass sheet 24 by a first vinyl interlayer 26; the second sheet 24 secured to a second vinyl-interlayer 28 by a first urethane interlayer 30, and the second vinyl interlayer 28 secured to a heatable member 32 by a second urethane interlayer 34.

An edge member or moisture barrier 36 of the type used in the art, e.g. but not limited to a silicone rubber or other flexible durable moisture resistant material is secured to (1) peripheral edge 38 of the windshield 20, i.e. the peripheral edge 38 of the first and second glass sheets 22, 24; of the first and second vinyl-interlayers 26, 28; of the first and second urethane interlayers 30, 34 and of the heatable member 32; (2) margins or marginal edges 40 of outer surface 42 of the windshield 14, i.e. the margins 40 of the outer surface 42 of the first glass sheet 22 of the windshield 14, and (3) margins or marginal edges 44 of outer surface 46 of the windshield 14, i.e. margins of the outer surface 46 of the heatable member 32.

As is appreciated by those skilled in the art and not limiting to the invention, the first and second glass sheets 22, 24; the first and second vinyl-interlayers 26, 28 and the first urethane interlayer 30 form the structural part, or inner segment, of the windshield 14 and the outer surface 42 of the windshield 14 faces the interior of the aircraft 10 (see FIG. 1), and the second urethane layer 34 and the heatable member 32 form the non-structural part, or outer segment, of the windshield 14, and the outer surface 46 of the windshield 14 faces the exterior of the aircraft 10. The heatable member 32 provides heat to remove fog from, and/or to melt ice on, the outer surface 46 of the windshield 14 in a manner discussed below.

As can be appreciated, the invention is not limited to the construction of the windshield 14 and any of the constructions of aircraft transparencies used in the art can be used in the practice of the invention. For example and not limited to the invention, the windshield 14 can include a construction wherein the second vinyl-interlayer 28 and the first urethane interlayer 30 are omitted, and/or the glass sheets 22 and 24 are plastic sheets.

Generally the glass sheets 22 and 24 of the windshield 14 are clear chemically strengthened glass sheets; however, the invention is not limited thereto, and the glass sheets 22 and 24 can be heat strengthened or heat tempered glass sheets. Further as is appreciated by those skilled in the art, the invention is not limited to the number of grass sheets 22 and 24, vinyl-interlayers 26 and 28, or urethane interlayers 30 and 34 that make up the windshield 14, and the windshield 14 can have any number of sheets and/or interlayers.

Figure 3:
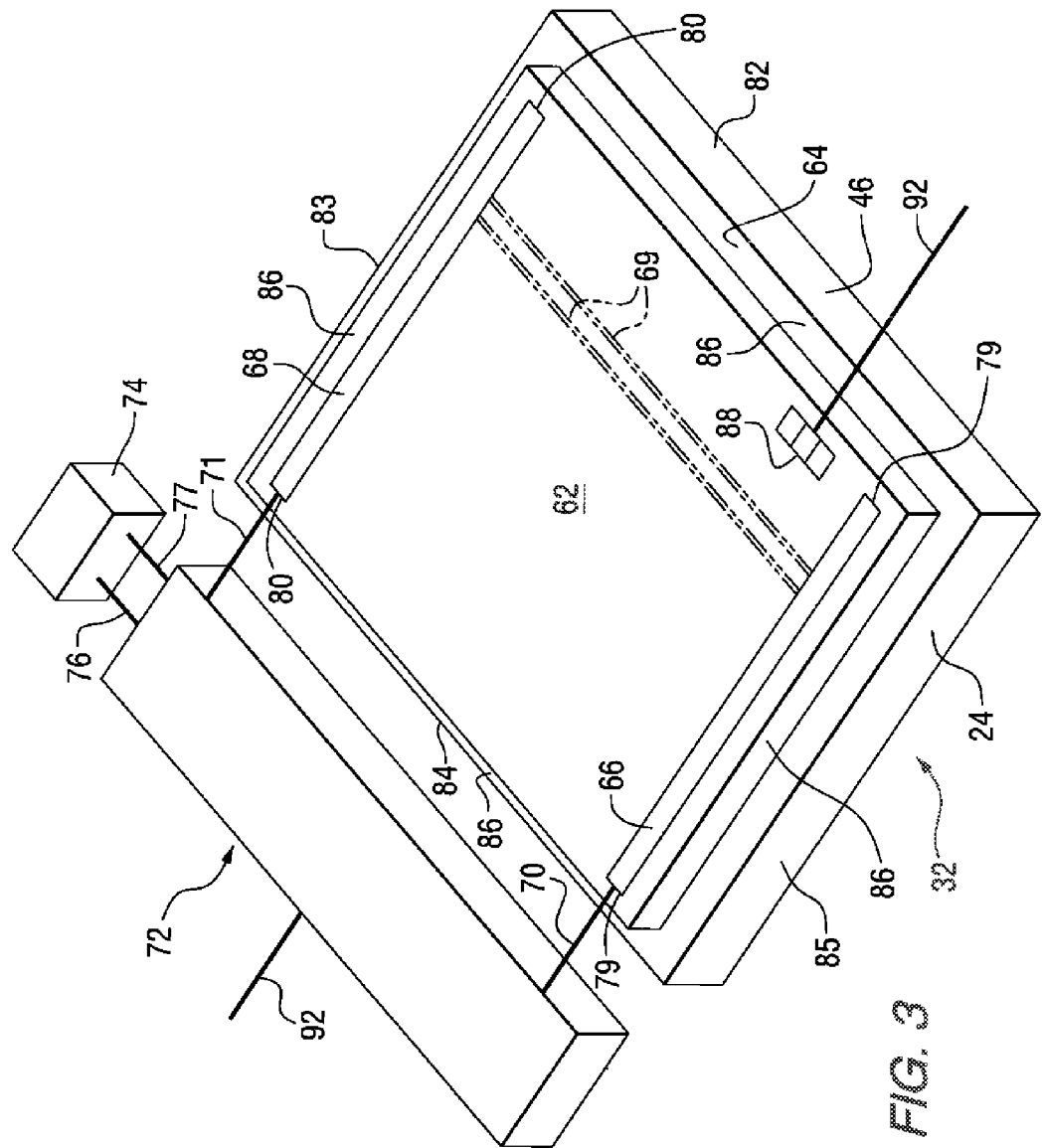
FIG. 3 is an isometric view of a heatable member of an aircraft transparency having a block diagram to indicate features of the invention to detect arcing of the heatable member.

The invention is not limited to the design and/or construction of the heatable member 32, and any electrical conductive heatable member used in the art to heat a surface of a sheet to prevent the formation of fog, snow and/or ice on, to melt snow and ice on, and/or to remove fog, snow and ice from, the outer surface of a windshield can be used in the practice of the invention. With reference to FIG. 3, in one non-limiting embodiment of the invention, the heatable member 32 includes the glass sheet 24 having a conductive coating 62 applied to surface 64 of the glass sheet 60, and a pair of spaced bus bars 86, 68 in electrical contact with the conductive coating 62. The invention is not limited to the composition of the conductive coating 62, and any of the electrical conductive coatings known in the art can be used in the practice of the invention. For example, and not limiting to the invention, the conductive coating 62 can be made from any suitable electrical conductive material. Non-limiting embodiments of conductive coatings that can be used in the practice of the invention include, but are not limited to, a pyrolytic deposited fluorine doped tin oxide film of the type sold by PPG Industries, Inc. under the registered trademark NESA; a magnetron sputter deposited tin doped indium oxide film of the type sold by PPG Industries, Inc. under the registered trademark NESATRON; a coating made up of one or more magnetron sputter deposited films, the films including, but not limited to a metal film, e.g. silver between metal oxide films, e.g. zinc oxide and/or zinc stannate, each of which can be applied sequentially by magnetron sputtering, e.g. as disclosed but not limited to, U.S. Pat. Nos. 4,610,771; 4,806,220 and 5,821,001. The disclosures of U.S. Pat. Nos. 4,610,771; 4,806,220 and 5,821,001 in their entirety are hereby incorporated by reference.

The invention is not limited to the use of an electrical conductive coating 62 to heat the glass sheet 24, and the invention contemplates the use of any type of member that can be electrically heated, e.g. but not limited to electrical conducting wires. The wires, e.g. wires 69 shown in phantom in FIGS. 2 and 3 can be embedded in a sheet of a plastic interlayer, e.g. but not limited to the second urethane interlayer 34 between the bus bars 66 and 68, and electrically connected to the bus bars 66 and 68. Such a heating arrangement is known in the art under the PPG industries Ohio, Inc, registered trademark AIRCON and is disclosed in U.S. Pat. No. 4,078,107, which patent in its entirety is incorporated herein by reference.

The invention is not limited to the design and/or construction of the bus bars 66 and 68, and any of the types of bus bars used in the art can be used in the practice of the invention. Examples of bus bars that can be used in the practice of the invention, include, but are not limited to, the types disclosed in U.S. Pat. Nos. 3,762,902; 4,623,389; 4,894,513; 4,994,650, and 4,902875, which patents in their entirety are hereby incorporated by reference.

In a non-limiting embodiment of the invention, the windshield 14 is provided with one or more sensors to monitor the performance of selected characteristics of the windshield 14. The design and operation of the sensors are not limiting to the invention, and the sensor can be any of the types known in the art, e.g. but not limiting to the invention, the sensor can be a moisture sensor; a conductive coating temperature sensor; an arc sensor; an impact sensor and/or a rupture sensor to name a few. A detailed discussion of the sensors is found in U.S. Pat. Nos. 8,155,816 and 8,383,994 and U.S. Published Patent Application 2013/0075531. In the non-limiting embodiment of the invention under discussion, the heatable windshield 14 has an arc sensor to monitor the performance of the heatable member 32, and an intelligent electrical power controller and monitoring system 72 (FIGS. 3-5) of the type disclosed in U.S. Published Patent Application 2013/0075531 to measure the performance of the heatable member and to shut down the heatable member when the intelligent electrical power controller and monitoring system 72 indicates that the windshield can be damaged by the unacceptable performance of the heatable member.

With continued reference to FIG. 3, in one non-limiting embodiment of the invention, each of the bus bars 66 and 68 are connected by wires 70 and 71, respectively, to the sensor or the intelligent electrical power controller and monitoring system 72 (discussed in detail in U.S. Published Patent Application 2013/0075531), and the controller and monitoring system 72 is connected to aircraft electrical power supply 74 by wires or electric cables 76 and 77. Although not limiting to the invention, ends 79 of the bus bar 66, and ends 80 of the bus bar 68 are spaced from adjacent sides 82-85 of the glass sheet 24, and sides 86 of the coating 62 are spaced from the sides 82-85 of the glass sheet 24, to prevent arcing of the bus bars 66 and 68, and the coating 62 with metal body cover 87 of the aircraft 18 (see FIG. 1).

A temperature sensor 88 is mounted on the conductive coating 62 to sense the temperature of the conductive coating 62 of the heatable member 32, and is connected to the intelligent electrical power controller and monitoring system 72 by a wire or electric cable 92. The invention is not limited to the temperature sensor 88, and any of the types used in the art can be used in the practice of the invention. Further, the invention is not limited to the number of temperature sensors 88 mounted on the coating 62, and any number of sensors, e.g. one, two or three sensors can be mounted on the coating 62 to sense the temperature of different areas of the coating 62. In one non-limiting embodiment of the invention, the temperature sensor 88 is a thermocouple, and three thermocouples spaced from one another (only one shown in FIG. 3) are mounted on the coating 62.

Figure 4:
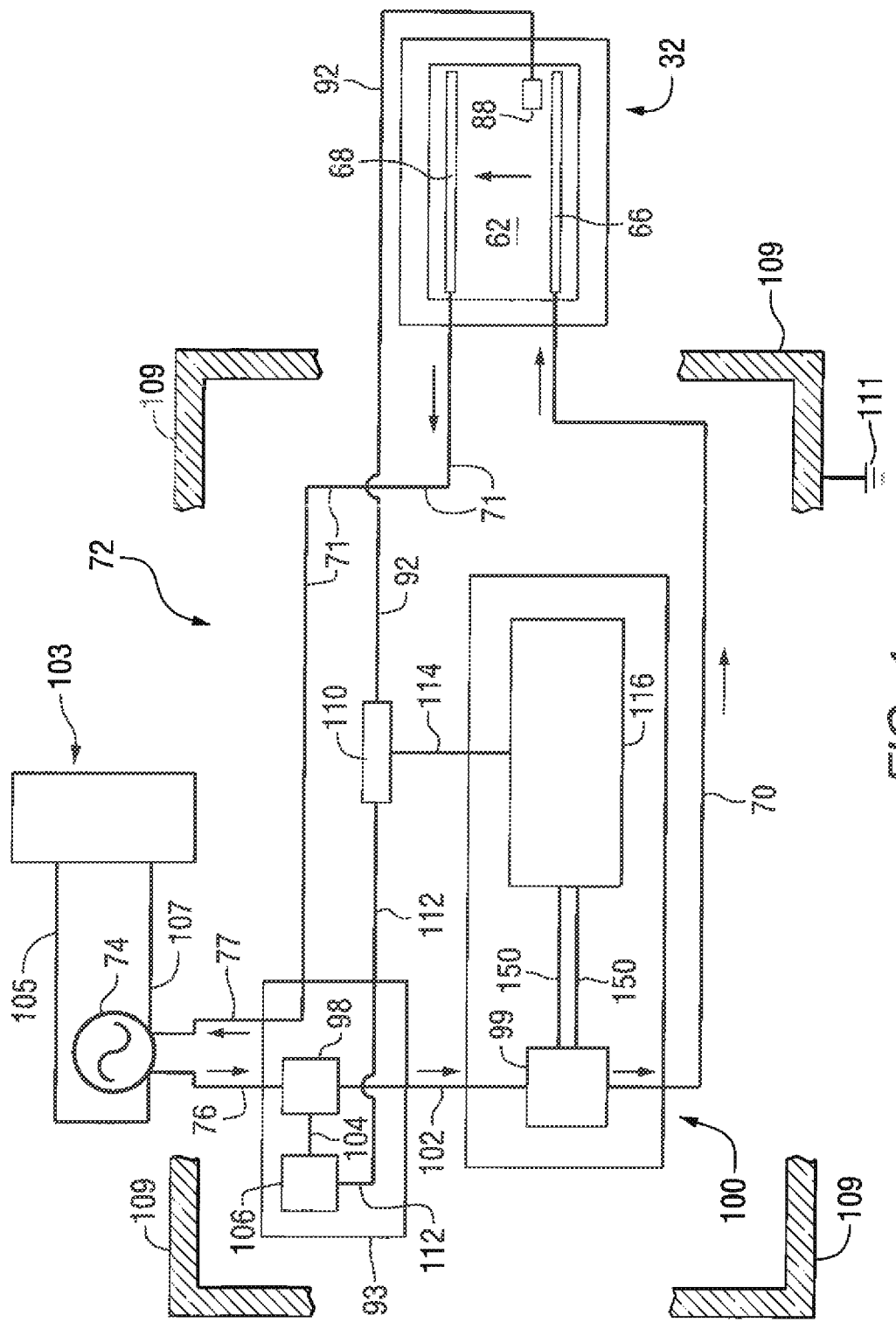
FIG. 4 is a block diagram of a non-limiting embodiment of an intelligent electrical power controller and monitoring system of the invention connecting an electrical power supply of the aircraft to the heatable member of the type shown in FIG. 3.

With reference to FIG. 4, in one non-limiting embodiment of the invention, the aircraft power supply 74 is connected by wires 76 and 77 to a window heat controller 93 of the intelligent electrical power controller and monitoring system 72. As is appreciated by those skilled in the art, the invention is not limited to the power supply 74 and the power supply 74 can be an alternating current supply as shown in FIG. 4 or a direct current supply as is known in the art. The wire 76 is connected to one pole of a switch 98 of the window heat controller 93, and the other pole of the switch 98 is connected to an arc sensor 99 of an arc monitoring and detecting system 100 of the invention by a wire or electric cable 102.

The invention is not limited to the type of current transformer 99 used in the practice of the invention. In the preferred practice of the invention, the current transformer 99 used was a current transformer to reduce the current to a lower level for ease of filtering the current moving along the wires 102 and 70.

The switch 98 is usually in the closed position and is moved from the closed position to the open position and vice versa by signals forwarded along wire or electric cable 104 from a control logic for a heat controller 106 of the window heat controller 93. The arc sensor 99 is connected to the bus bar 66 of the heatable member 32 by the wire 70. The bus bar 68 of the heatable member 32 is connected to the power supply 74 by the wire 71.

Other electrical components 103 (shown only in FIG. 4, and for purposes of clarity are shown as a block diagram 103) of the aircraft 10 are connected to the power supply 74 by the wires 105 and 107. The invention is not limited to the electrical components 103 and include but are not limited to safety devices, e.g. but not limited to flight performance instruments, convenient devices, e.g. but not limited to passenger and flight crew air conditioning and passenger assisting devices, e.g. but not limited wireless connections and wireless electromagnetic interference.

In one non-limiting embodiment of the invention, components of the intelligent electrical power controller and monitoring system 72 are mounted in a Faraday box 109, and the Faraday box 109 (shown only in FIG. 4) connected to ground, e.g. the body 81 of the aircraft 18 (see FIG. 1) by the wire or cable 111 (see FIG. 4) to block out external static electric fields and electromagnetic interference.

With continued reference to FIG. 4, the temperature sensor 88 is connected to one pole of an electronic switch 110 by the wire 92, and a second pole of the switch 110 is connected by wire 112 to the control logic 106 of the window heat controller 93. The switch 110 is usually in the closed position and is moved from the closed position to the open position and from the open position to the closed position by signals forwarded to the switch 110 along wire or electric cable 114 from a signal filtering and modifying system 116 of the arc monitoring and detecting system 100.

In one non-limiting embodiment of the invention, the arc monitoring and detecting system 100 electrically disconnects the heating member 32 and the power supply 74 from one another when predetermined conditions are detected. In the non-limiting embodiment of the invention under discussion, the predetermined condition of interest is major arcing of the heatable member 32. As used herein "major arcing" is defined as measured voltage/current, for example passing through the heatable member 32, exceeding a predetermined level. Optionally and not limiting to the invention, predetermined conditions can include but are not limited to the temperature of the heatable member 32 greater than a predetermined temperature and "micro arcing" as discussed in U.S. Published Patent Application 2013/0075531. "micro arcing" is defined as the measured voltage/current exceeding a predetermined value and less than the predetermined value for major arcing. Detailed discussions of the predetermined conditions discussed above are discussed in more detail in U.S. Published Patent Application 2013/0075531 and no further discussion is deemed necessary.

The discussion is now directed to the signal monitoring and detecting system 100, which is designed to detect "major-arcing", and to take action to prevent damage to the heatable member 32 and/or the window 20, in accordance to the teachings of the invention. As presented above, "major arcing" is defined as measured voltage/current exceeding a predetermined level. The value of the predetermined level is not limiting to the invention, and the value can be based on prior experience that major arcing at the predetermined level can damage the window 20.

Consider now the case when there is major arcing. The arc sensor 99 (FIG. 4) forwards a signal to the signal filtering and modifying system 116. The signal filtering and modifying system 116 determines that there is major arcing forwards a signal along the wire 114 to open the switch 110. The control logic of heat controller 106 determines that the switch 110 is in the open position and sends a signal along the wire 104 to open the switch 98 to electrically disconnect the power supply 74 and the heatable member 32 from one another. As can be appreciated by those skilled in the art, when there is major-arcing, the switch 110 and/or the switch 98 (FIG. 4) are opened.

Figure 5:
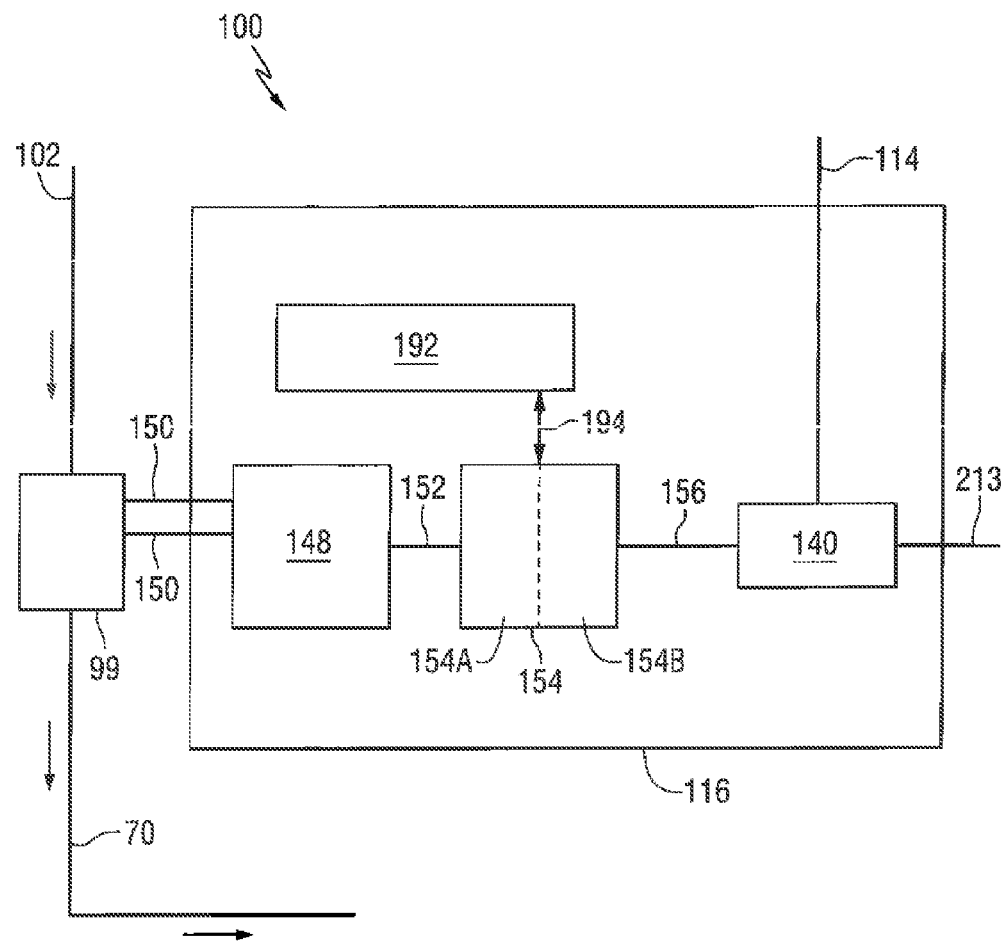
FIG. 5 is a block diagram of a non-limiting embodiment of an arc monitoring system that can be used in the practice of the invention.

With reference to FIG. 5, the discussion is now directed to a signal filtering and modifying system 116 of an arc monitoring and detection system 100 that can be used in the practice of the invention. The signal filtering and modifying system 116 is developed to detect major-arcing in accordance to the teachings of the invention and take action to prevent or limit damage to the heatable member 32 and/or the windshield 20.

The switch 98 and the switch 110 (see FIG. 4) are of the type that open and close in response to signals forwarded to the switch. The control logic of the heat controller 106 of the window heat controller 93 was a comparator of the type that compares the electrical signal, sensor 88 to a set range, and when the signal is outside of the range, the control logic of the heat controller 106 forwards a signal to open the switch 98, and when the signal is within the range, the control logic of the heat controller 106 sends a signal along the wire 104 to close the switch 98.

A feature of the control logic of the heat controller 106 is its ability to open and close the switch 98 when there is no major-arcing. Consider now when there is major-arcing. The switches 110 and 98 remain open until the arcing problem is resolved. After the arcing problem is resolved, the switch 110 is closed. The switch 110 can be closed manually, or by a signal from filtering and processing system 116 because there no longer is major-arcing. In another non-limiting embodiment of the invention, once major arcing is detected, the switch 110 remains open until the pilot resets (closes) the switch, e.g. but not limited to the pilot pressing a reset function in the cockpit control panel to close the switch. If the arcing continues to exist, the sensor will open the switch again. With this arrangement, the pilot ultimately controls the cockpit window heating capability.

With reference to FIG. 5, the signal filter 148 of the signal filtering and processing system 116 is a filter selected to be compatible with the electrical power supply 74 for energizing the conductive coating 62 of the heatable member 28. In one non-limiting embodiment of the invention, the power supply 74, e.g. for a Gulfstream aircraft has a main AC power supply frequency of 400 Hz. In this instance, the filter 148 is selected in the practice of the invention, but not limiting to the invention, is a high pass filter with a cutoff frequency of 400 Hz. As can be appreciated, other aircrafts can have other filters, e.g. greater than 400 Hz, e.g. 500 Hz, or less than 400 Hz, e.g. 100 Hz.

The filtered signal from the filter 148 is passed along wire 152 to a two stage comparator 154. The first stage 154A of the comparator 154 has a dual function. One function is to filter out signals having current/voltage levels above a predetermined value when generating an electronic fingerprint (discussed in detail below). Another function of the first stage 154A of the comparator 154 is to compare the electronic fingerprint to the real time electronic signal (discussed in detail below) to determine operating performance of the heatable member 32. For example and not limiting to the invention, a count is forwarded by the first stage 154A, to the second stage comparator 154B, of the comparator 154 each time the real time electronic signal is higher than the predetermined value of major arcing.

The second stage 154B of the comparator 154 also has a dual function. One function is to change the predetermined value or level for major arcing of the electronic fingerprint. Another function of the second stage 154B of the comparator 154 is to determine the duration in a given period of time that the real time electronic signal exceeds the predetermined value for major arcing. When the time exceeds a predetermined time period, a signal from the second stage 164B of the comparator 154 is sent along the line 156 to the signal switch 140 that major arcing has been detected, and the signal switch 140 sends a signal along the line 114 to open the switch 110, which causes the control logic of the heat controller 106 to open the switch 98 to prevent the current from moving from the power supply 74 to the heatable member 32 (see FIG. 4) as discussed above.

In the preferred practice of the invention, but not limited thereto, the performance of a component of the aircraft, e.g. but not limited thereto, the arcing of the heatable member 32 of the windshield 14 is determined by comparing an initial electronic fingerprint to a real time electronic signal and analyzing the difference to determine if the heating member 32 is operating within acceptable limits. From detailed observations of the electrical network of aircrafts, it was determined that the aircraft has an electronic fingerprint, and from various experiments it was determined that changes in the electronic signal or fingerprint can be used to determine if the aircraft component, e.g. the heatable member 32 is operating within acceptable limits. The term "initial electronic fingerprint" means a measurement of current or voltage as a function of time moving through the wiring of the aircraft having the component of interest, e.g. the windshield 14 having the heatable member 32 mounted in position to the body of the aircraft, and electrically connected to a power source of the aircraft 10. It is accepted that the aircraft component is operating within limits at the time the "initial electronic fingerprint" is made. The term "real time electronic signal" means a measurement of current and/or voltage as a function of time moving through the wiring of the aircraft after an "initial electronic fingerprint" is taken.

Figure 6:
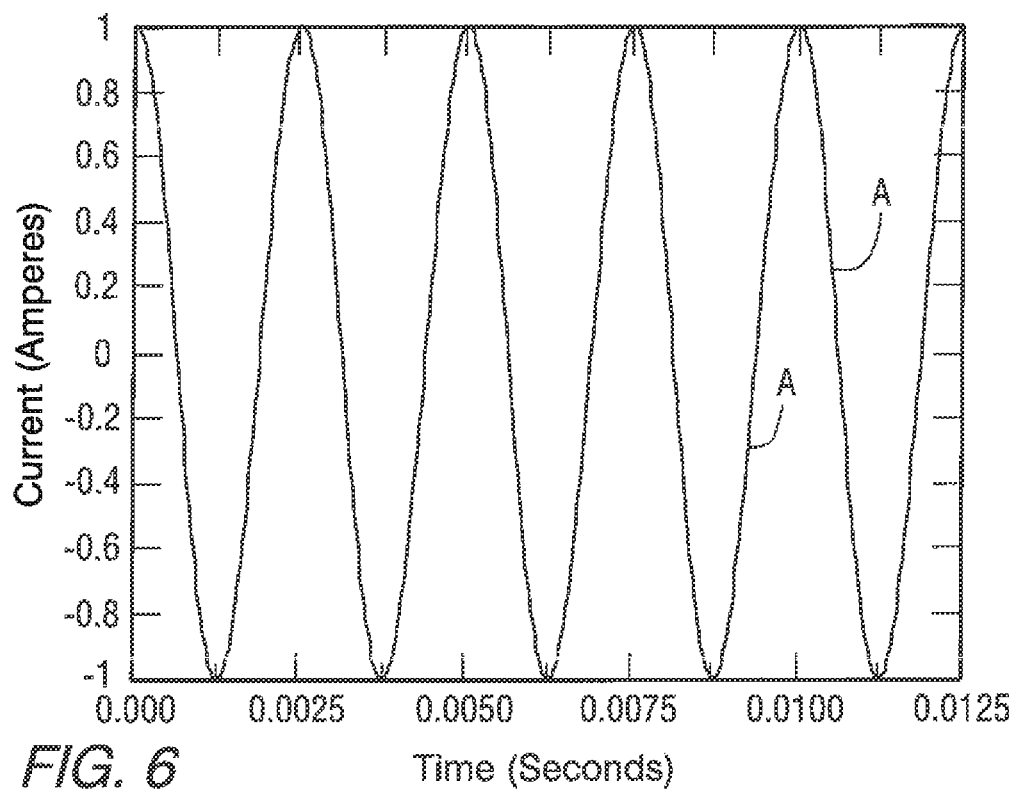
FIG. 6 is a curve or graph simulating current signal as a function of time moving through a heatable member.
Figure 7:
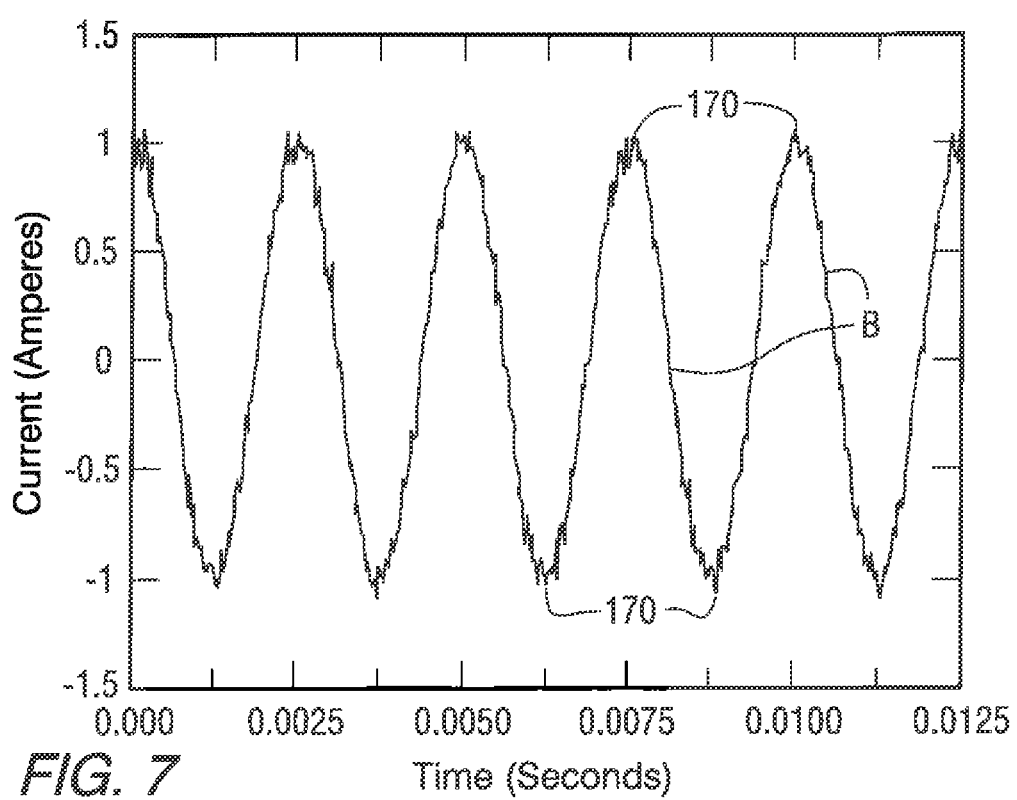
FIGS. 7-9 are curves simulating the curve of FIG. 6 with different levels of electrical background noise.

The discussion is now directed to the graphs of FIGS. 6-16. Unless indicated otherwise, the graphs of FIGS. 6-16 are simulated using simulation hardware/software developed by Math forks of Natick, Mass., U.S.A. Shown in FIG. 6 is a curve or graph A simulating data points for a heating current in amperes passing through the bus bars 66 and 68 and the conductive coating 62 of the heatable member 32 of a newly fabricated windshield 14 as a function of time, more particularly as a function of seconds. Curve or graph B of FIG. 7 simulates the data points of the graph A of FIG. 6 plus 5% electronic noise contributed by the electronic components of a small class aircraft, e.g. a Cessna aircraft. Curve or graph C of FIG. 8 simulates the data points for graph A of FIG. 6 plus 20% electronic noise contributed by the electronic components of a medium class aircraft, e.g. a Gulfstream G550. Curve or graph D of FIG. 9 simulates the data points for graph A of FIG. 6 plus 40% electronic noise contributed by the electronic components of a large class aircraft, e.g. a Boeing 737.

From the curves or graphs B (FIG. 7), C (FIG. 8) and D (FIG. 9) it is noted that additional electronic noise is added to the data points of graph A of FIG. 6 because the larger aircrafts usually have more electrical components than the smaller aircrafts. It has been determined that background noise generated by the aircraft can have very large magnitude of the signal spikes 170 due to the aircraft instrument operation. The signal spikes 170 can miss-trigger the sensors, e.g. but not limited to the intelligent arc sensor 72. To improve the reliability of the arc detection and minimize false alarms, the initial electronic fingerprint is mathematically combined with and/or compared to the real time electronic signal. In this manner, the current signals of the heatable member 32 and minimal background noise remains, and the performance of the heatable member, e.g. arcing of the heatable member 32 is determined by analyzing the difference between the initial electronic fingerprint and the real time electronic signal, e.g. but not limited to the manner discussed below.

For the purposes of describing the invention, but not limiting to the invention, a small aircraft is normal category (maximum takeoff weight of 12,500 pounds and maximum passenger seating capacity of 9), a medium aircraft is commuter category (maximum takeoff weight of 19,000 pounds and maximum passenger seating capacity of 19), and a large aircraft is transport category (minimum takeoff weight of 19,000 pounds and minimum passenger seating capacity of 19).

Figure 10:
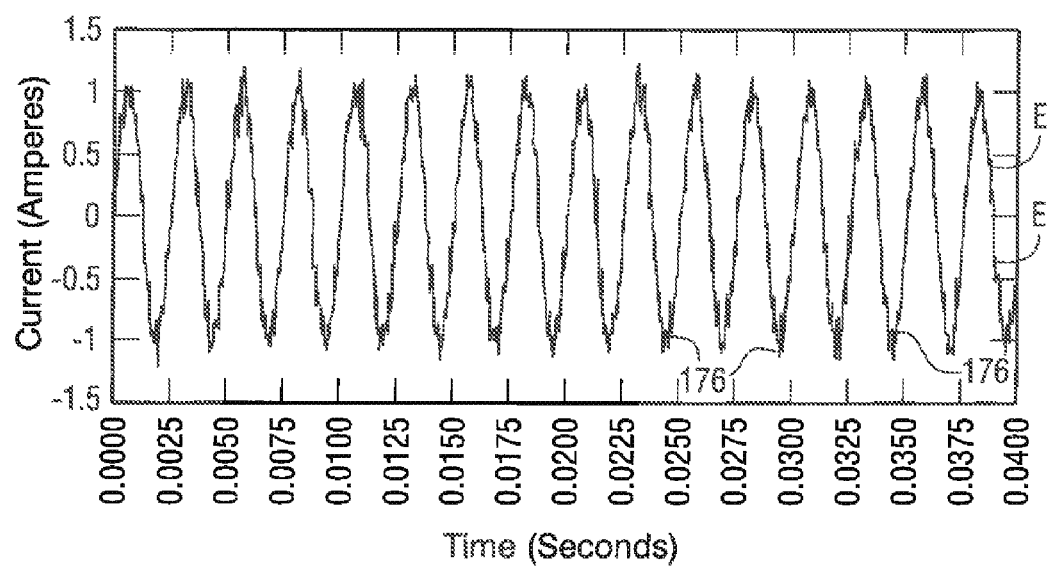
FIGS. 10-13 are curves simulating window heating current with and without major arcing.
Figure 11:
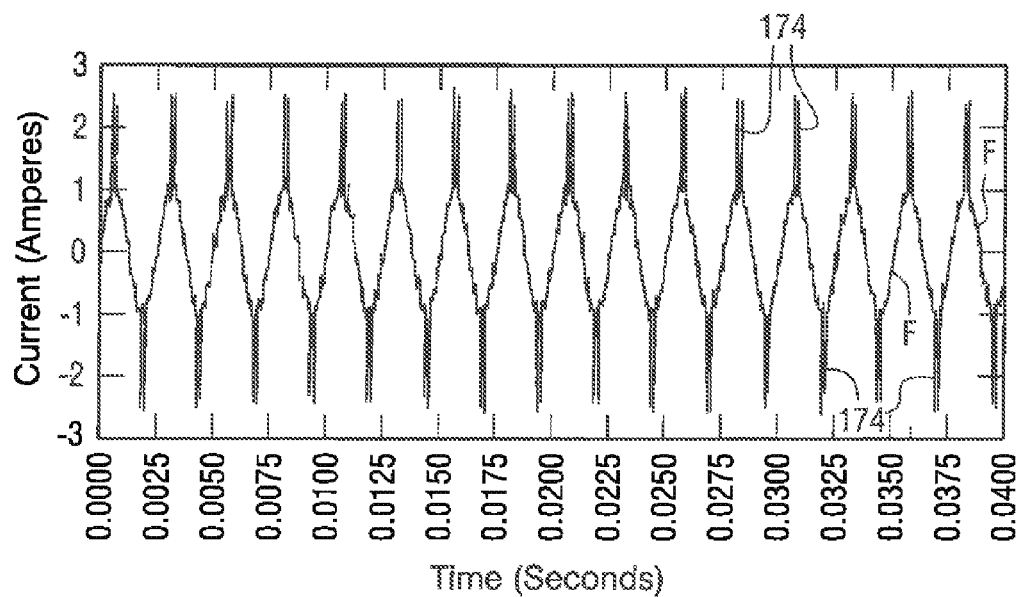
Figure 12:
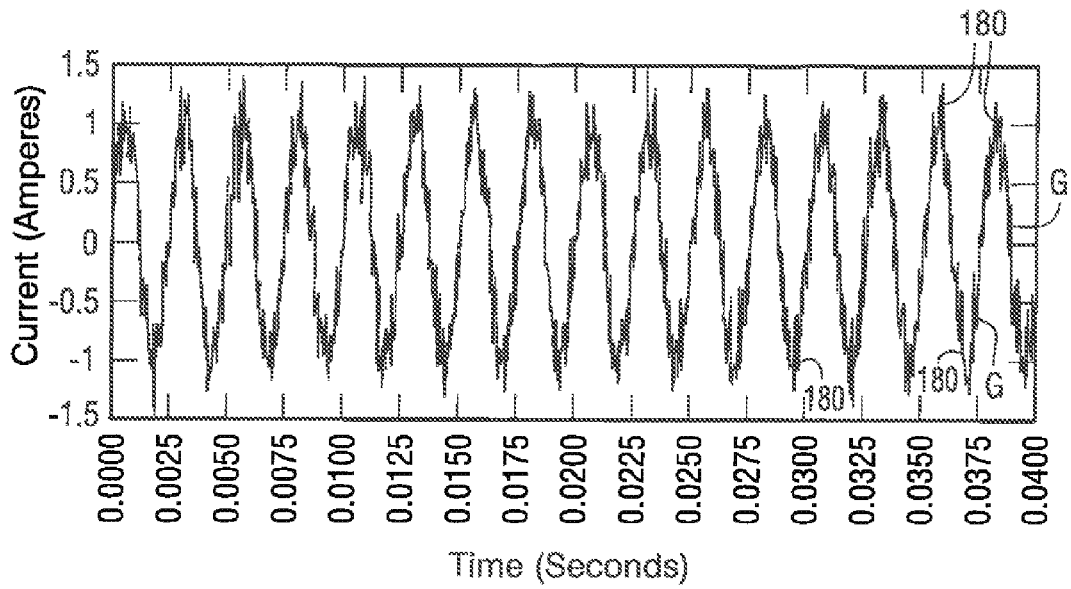
Figure 13:
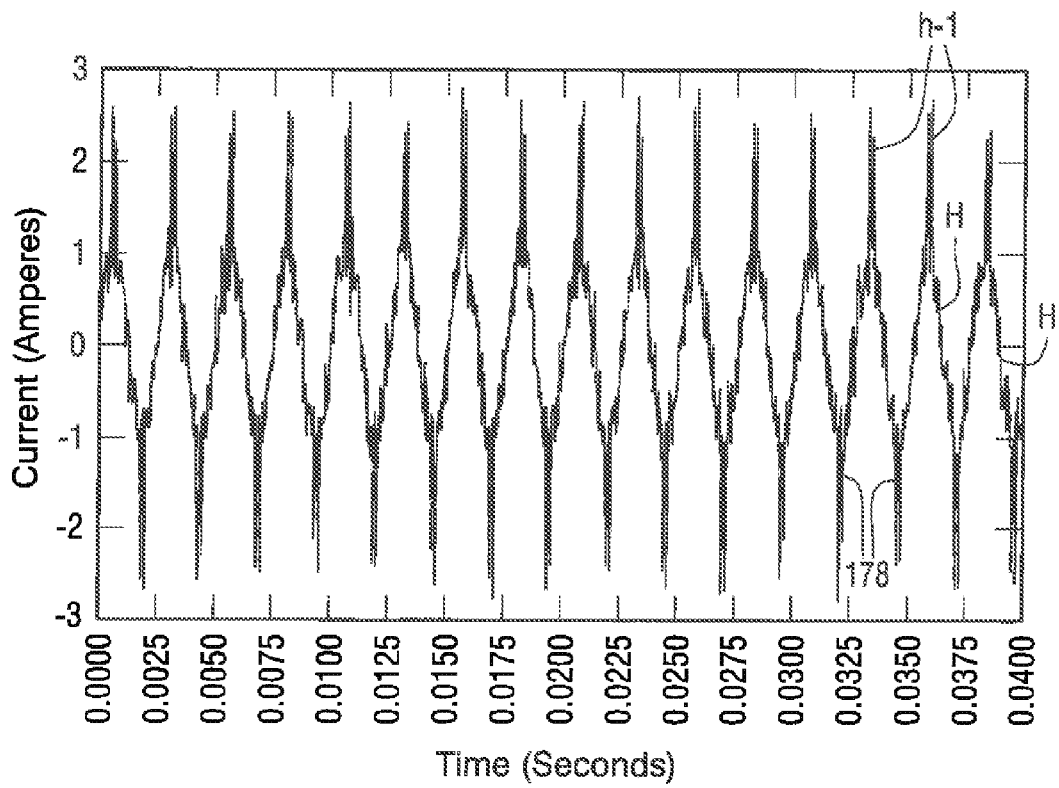

Shown in FIGS. 10-13 are differences between curves or graphs with arcing (FIGS. 11 and 13) and without arcing (FIGS. 10 and 12) for small aircrafts (FIGS. 10 and 11) and medium aircrafts (FIGS. 12 and 13). More particularly, graph E of FIG. 10 shows data points for a small aircraft with no major arcing; graph F of FIG. 11 shows data points for a small aircraft with major arcing; graph G of FIG. 12 shows data points for a medium aircraft with no major arcing, and graph H of FIG. 13 shows data points for a medium aircraft with major arcing.

A difference between graphs E and F shown in FIGS. 10 and 11, respectively, is that the extended portion 174 of the graph F of FIG. 11 is longer than the extended portion 176 of the graph E of FIG. 10 indicating that major arcing of the heating member is in effect. Likewise a difference between graphs S and H shown in FIGS. 12 and 13, respectively, is that the extended portion 178 of the graph H of FIG. 13 is longer than the extended portion 180 of the graph G of FIG. 12 indicating that major arcing of the heating member is in effect.

Figure 14:
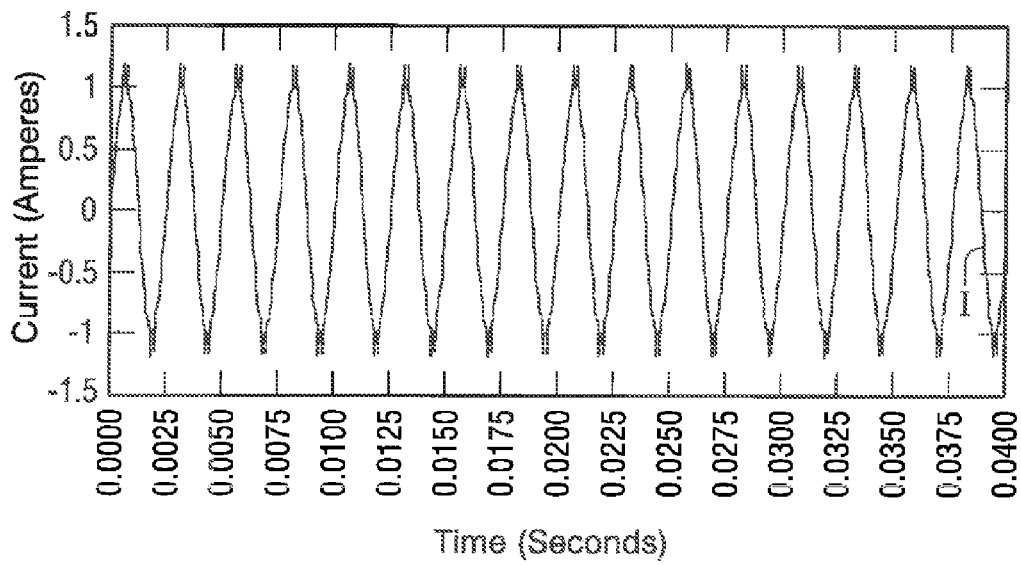
FIGS. 14-16 are curves simulating heating current with and without micro-arcing.
Figure 15:
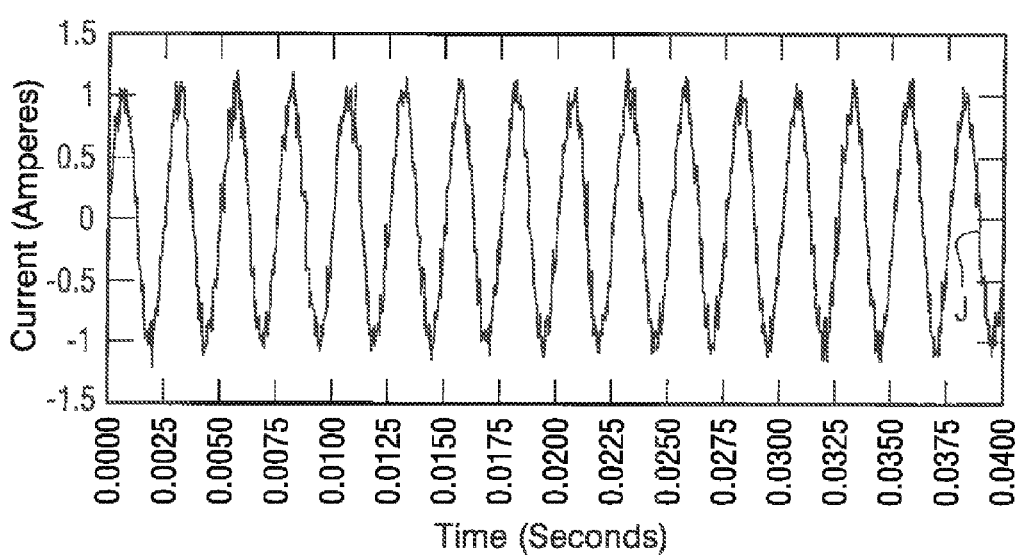
Figure 16:
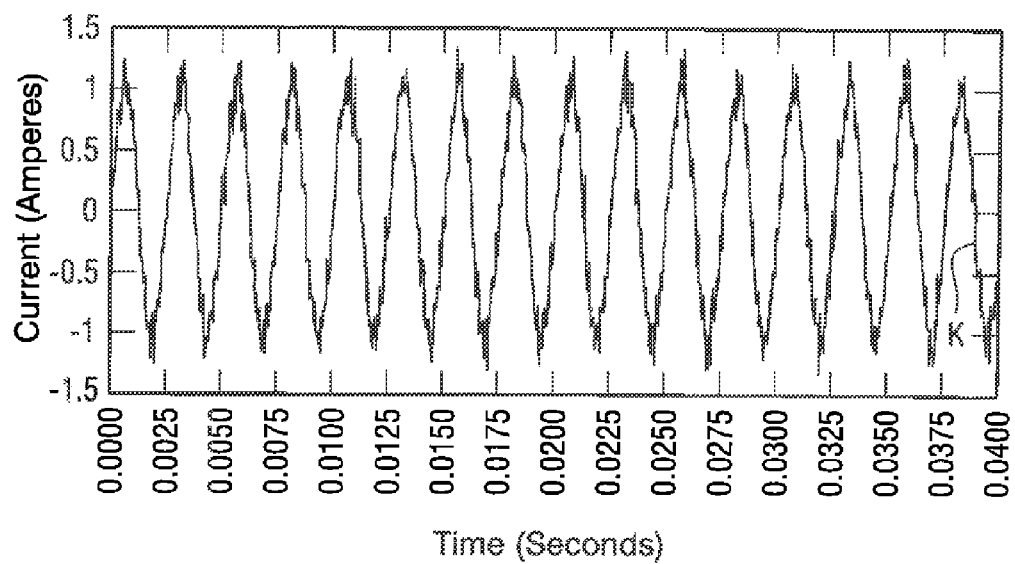

As can now be appreciated, the invention can be practiced when the heating member 32 has micro-arcing. As used herein "micro-arcing" is defined as the measured voltage/current exceeding a predetermined value that is less than the predetermined value for major arcing. For purposes of this discussion major arcing will have much more magnitude in terms of the percentage of the signal. With reference to FIGS. 14-16 as needed, curve or graph I of FIG. 14 is a simulation of windshield heating current with micro-arcing without background noise; graph J shown in FIG. 15 is a curve or graph simulating background electrical noise without micro-arcing, and graph K shown in FIG. 16 is a simulation showing micro-arcing embedded into the background noise. As can now be appreciated, graph K of FIG. 16 is the real time electrical heating current signal with micro arcing and background noise. As is appreciated by those skilled in the art, generally initial micro-arcing does not require that the heating member 32 be disconnected from the power supply (74, FIG. 4). Monitoring micro-arcing can be used to prevent major arcing and prevent damage to the window. As can be appreciated by those skilled in the art, the discussion of detecting major arcing is applicable to determining micro arcing.

The discussion is now directed to a non-limiting embodiment of the invention to generate an initial electronic fingerprint of an aircraft, and to use the initial electronic fingerprint to determine if a component of the aircraft, e.g. but not limited thereto, a heatable member of an aircraft windshield, is operating within an acceptable range. Although not limiting to the invention, the windshield used to generate the initial electronic fingerprint is operating within acceptable limits. This can be verified using any testing manner, e.g. but not limited to bench testing the heatable member of a windshield at the manufacturing facility of the windshield, and/or the repair center for aircraft components, or mounting the windshield having the heatable member on the aircraft, electrically connecting only the heatable member to a power supply to move a current through the heatable member 32. The current moving through the heatable member 32 is monitored using any arc detecting algorithm to determine if the heatable member is operating within acceptable limits.

The invention is not limited to the arc detecting algorithm and any arc detecting algorithm known in the art can be used in the practice of the invention to determine if the heatable member 32 (FIG. 3) is operating within acceptable limits. After the performance of the heatable member is determined to be acceptable, the windshield having the heatable member is mounted to the aircraft and electrically connected to the power supply of the aircraft. The aircraft having the heatable member is operated for a predetermined period of time and the data relating to the current or voltage as a function of time is collected and acted on in the manner discussed below to generate an initial electronic fingerprint of the electric circuit of the aircraft having the heatable member 32. The invention is not limited to the predetermined period of time, and the invention considers greater than zero to three hundred hours, greater than zero to two hundred hours, greater than zero to one hundred hours, 10 to 30 hours, and 30 hours, of normal operating flight time to be sufficient predetermined time.

Figure 8:
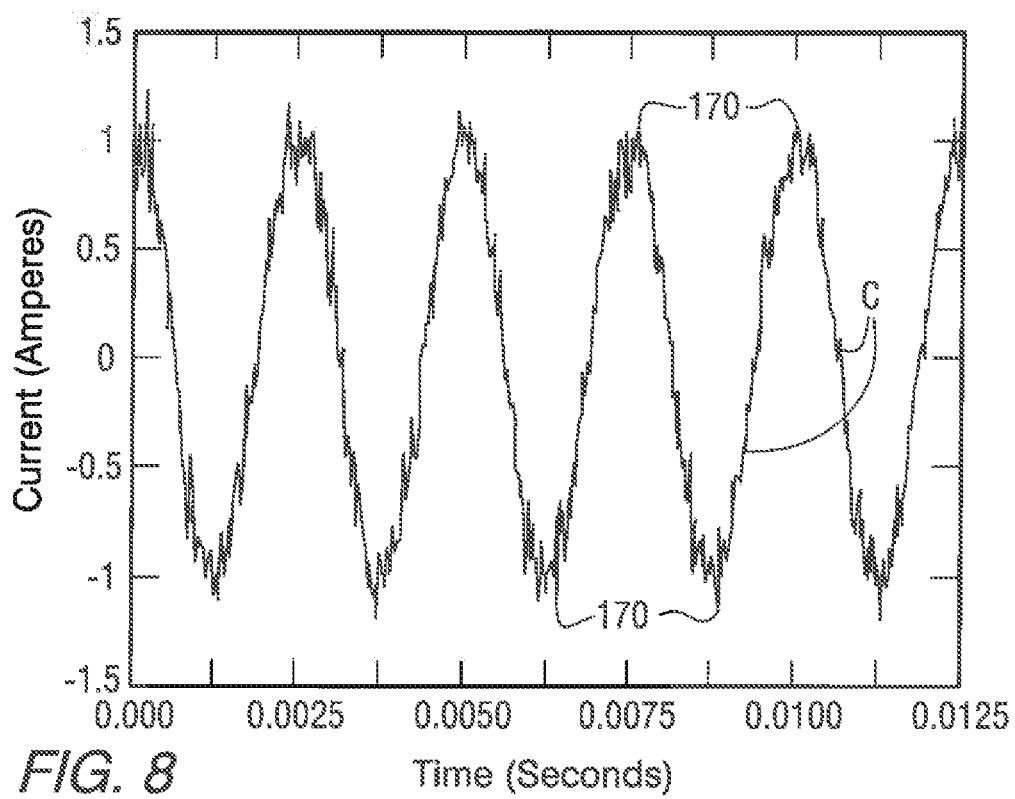
Figure 9:
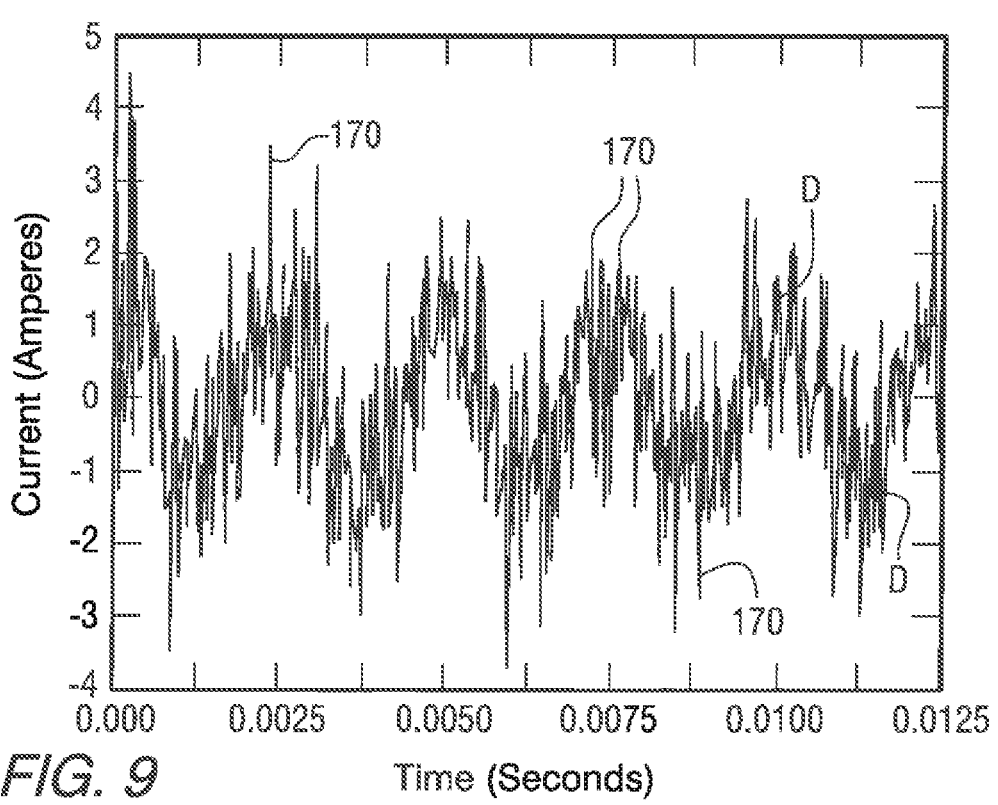

The discussion is now directed to a non-limiting embodiment of the invention to develop an initial electronic fingerprint. With reference to FIG. 8, and not limiting to the invention, there is shown a curve C simulating the windshield heating current with 20% noise. With reference to FIGS. 4 and 5 as needed, the current is passed through the transformer 99 to reduce the current, and to pass the reduced current signal through the filter 148. The current or signal is then passed to the 2 stage comparator 154 having the comparator stage one 154A and the comparator stage two 154B. In a non-limiting embodiment of the invention, the filter 148 is selected to be a high pass filter with cutoff frequency of 500 Hz based on aircraft powering category. For example and not limiting to the invention, a cutoff frequency of 500 Hz is usually selected for alternating electrical current powered aircraft; 100 Hz is usually selected for direct electrical current powered aircraft, and 600 Hz drive filters is usually selected for each leg of a 3 phase electrical powered driven aircraft. As can now be appreciated the invention is not limited to the value of the filter 148 and the value of the filter 148 is preferably selected to provide the appropriate filtering level for power to the heatable member 32 (see FIG. 3).

In generating the fingerprint value for comparator stage one 154A, the comparator stage two 154 B is set for counting a time threshold to a predetermined number within a predetermined time window or cell. When the time count reaches the time threshold and the time window has not ended, the count starts again. The count is restarted each time the time threshold is reached and the time window has not ended. When the time window has ended, the time count also ends, and the predetermined time window and the time count start over again.

The invention is not limited to the time length of a count. In one non-limiting embodiment of the invention, the time length of a count is one millisecond; the time count is 100 (100 milliseconds), and the predetermined time window is 500 milliseconds.

The comparator stage one 154A functions to provide an electrical voltage or current level for the time count and the predetermined time window. In one non-limited embodiment of the invention the power level is set for a fraction of an ampere, e.g. but not limited to a tenth or a quarter of an ampere. The data generated by the comparator stage one 154A and comparator stage two 154B is sent to the electronic storage 192 along cable 194.

Figure 17:
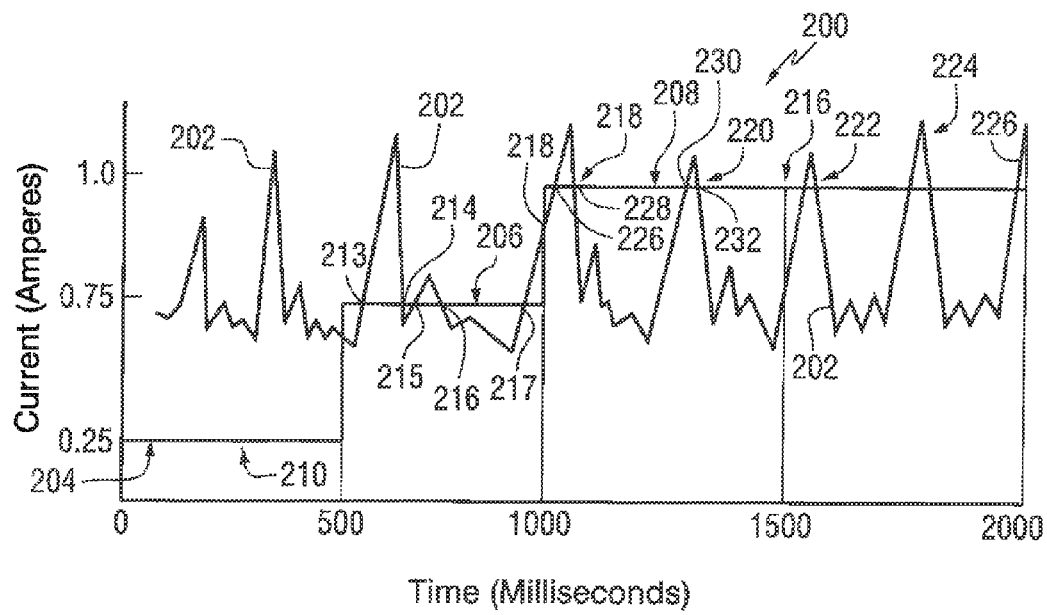
FIG. 17 is a graph showing curves of current as a function of time to determine an electronic fingerprint.

With reference to FIG. 17, there is a graph 200 showing a curve 202 of data points generated by the current passing through the 500 Hz filter 148. The graph 200 has thresholds 204, 206 and 208 provided by the comparator stage one 154 A in the manner discussed below during the process of generating the initial electronic fingerprint. In this non-limiting embodiment of the invention, the predetermined time window is in increments of 500 milliseconds set by the comparator 154. The time count threshold is set by the comparator stage one 154A for one hundred milliseconds. The time count increments are made during the time period that the curve 202 exceeds the thresholds 204, 206 and 208.

By way of illustration and not limiting to the invention, the threshold level 204 in FIG. 17 extends from 0 to 500 milliseconds or one cell. In this non-limited embodiment of the invention a time count of 100 in a predetermined time window of 500 milliseconds is an indication of major arcing of the heatable member 32. Stated another way, a time count less than 100 for the predetermined time window of 500 milliseconds indicates no major arcing. As can be appreciated, the threshold level of 204 shown in FIG. 17 indicates major arcing; however, the windshield 32 was pretested and has no major arcing. Therefore, the indication of major arcing is an indication that the threshold level 204 of 0.25 amperes is too low and not that there is major arcing.

The comparator stage one 154A is then adjusted to provide a higher set point or threshold level, e.g. in the non-limiting embodiment of the invention under discussion, the threshold level 206 is raised to 0.75 amperes. As can now be appreciated, the invention is not limited to the amount of current level increase. For example and not limiting to the invention, the current level can be increased by greater than zero to 5%; greater than zero to 10%, greater than zero to 20%, greater than zero to 40%, greater than zero to 60%, greater than zero to 80%, and greater than zero to 100% greater than zero to 200%, greater than zero to 300%, greater than zero to 400%. In the non-limiting discussion of the invention the current level 204 is raised 300% to current level 206 of 0.75 amperes, however, in the preferred practice of the invention the current level is raised 25%.

With reference to FIG. 17, the invention is not limited to the amount of set point or threshold level increase. As can be appreciated and not limiting to the invention, the current level of 0.25 amperes is selected such that the current level is lower than expected noise level shown by Graph 202 (FIG. 17) of the heatable member 32 (FIG. 3) of the windshield 14 and/or the current or voltage of the aircraft to make certain that the noise level of the aircraft and performance of the heatable member 32 is considered.

The time count begins for threshold level 206 at point 213 and stops at point 214, the count continues at point 215 and stops at point 216, and the count continues at point 217 and stops at point 218. In this example, the window between 500 to 1000 milliseconds will have time count greater than 100. Greater than one time count of 100 indicates major arcing, however as discussed above the windshield was pretested and the greater than one time count does not indicate that the windshield has major arcing, but indicates that the set point or current level is too low.

With continued reference to FIGS. 5 and 17, the comparator stage one 154A is acted on to raise the threshold 206 by 33 and ⅓% to one ampere. The threshold is now designate by the number 208. The time count begins at point 226 and stops at point 228, continuous at point 230 and stops at point 232. In this example the time count for the window between 1000 and 1500 ms is 30, or less than 100 indicating that the threshold 208 can be used in the initial electronic fingerprint. This procedure is continued for the desired fingerprint duration time. In this example, the window between 1500 to 2000 milliseconds and all subsequent cells are expected to have a count of less than 100. After the fingerprinting is completed, all cells will have a count less than 100 when there is no major arcing, and will have a count of 100 or more when there is major arcing. The threshold level 208 is the control set point of the initial electronic fingerprint used to determine arcing.

During the fingerprint period, the threshold set point of comparator side one 154A is continuously verified for periods of time, e.g. but not limited to 30 hours, if the threshold set point of the comparator side one 154A is two low, then the 30 hour time period is reset and the comparator side one 154A incrementally changes, e.g. but not limited to the invention manually or automatically as discussed above.

The initial electronic fingerprint for FIG. 17 is a 500 Hz filter (148, FIG. 5), a time count of 100 (comparator side two 154B) and a threshold set point of one ampere (set point from comparator side one 154A). As can be appreciated by those skilled in the art, the invention can be practiced by starting the threshold level at a maximum value and lowering the threshold level to attain the threshold set point. Although, not limiting to the invention, the value of the threshold set point of comparator stage two 154B determined in the manner presented above can be increased to compensate for additional electrical noise variability.

In one non-limiting embodiment of the invention the initial electronic fingerprint is defined by the value of the filter (148, see FIG. 5), the time count (of the comparator side two 154B), the threshold set point (provided by the comparator side one 154A), which is the electric current value or voltage value at which the major arcing is detected. By way of illustration, the electronic fingerprint for a first aircraft was a 500 Hz filter (148, FIG. 5), a time count of 100 milliseconds (comparator side two 154B), and a control set point of one ampere (set point from comparator side one 154A). The electronic fingerprint for a second aircraft was a 400 Hz filter (148, FIG. 5); a time count of 70 milliseconds (comparator side two 154*b*) and a threshold set point of two ampere (comparator side one 154A). The electronic fingerprint for a third aircraft was a 100 Hz filter (148, FIG. 5), a time count of 200 milliseconds (comparator side two 154 B), and a threshold set point of five amperes (comparator side one 154A).

As can now be appreciated, the invention is not limited to the length of the predetermined time window and in general it is a function of the capabilities of the electric equipment.

Figure 18:
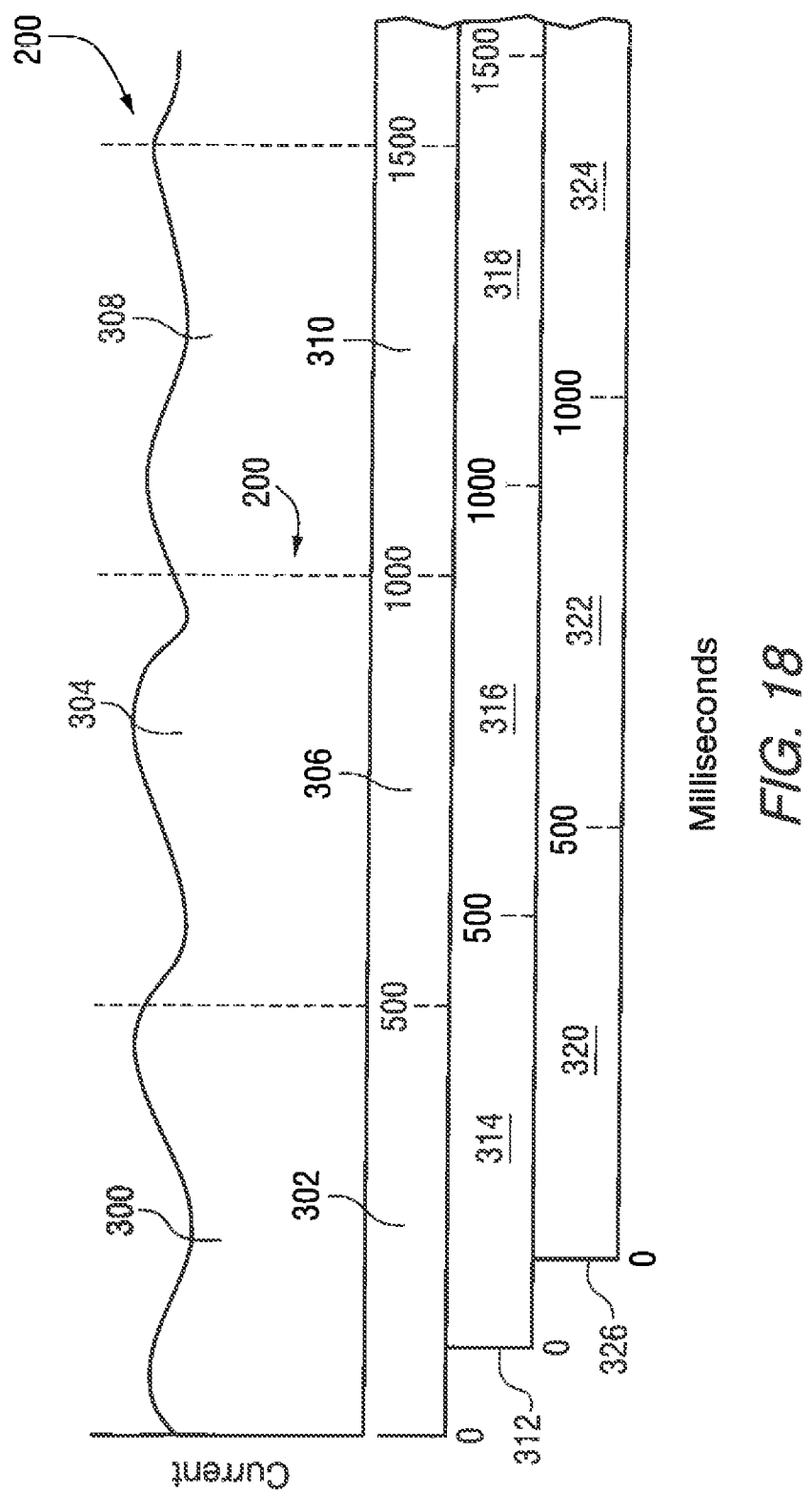
FIG. 18 is diagram showing the shifting of a time period in accordance to the teachings of the invention.

As can be appreciated by those skilled in the art, in another non-limiting embodiment of the invention, the initial electronic fingerprint can be made up of more or fewer components that are filters, mathematical operations, signal conditioning, etc. Further and with reference to FIG. 18, the invention contemplates making the time count on sliding windows. As shown in FIG. 18, the initial position of window 300 is represented by bar 302 between 0 and 500 milliseconds; the initial position of window 304 is represented by bar 306 and is between 500 and 1000 milliseconds, and the window 308 is represented by the bar 310 and is between 1000 and 1500 milliseconds. When the time period of the window 300 ends, a portion of the bar 302 representing the window 300; a portion of the bar 306 representing the window 304; and a portion of the bar 310 representing the window 308 shifts to the right as viewed in FIG. 18. The time count begins at the end portion 312 of the bar 314 now representing the window 300 having a portion of the window 300 and a portion of the window 304. At the end of the count with the bar 314, the bars 314, 316 and 318 shift to the right and are now represented by the bars 320, 322 and 324, respectively. The time count now begins at end 326 of the bar 320 with the bar 320 representing the window 300 which includes portions of the window 300 and 304.

The invention is not limited to the amount of the window replaced and the amount can be can be greater than zero to 10%, 5% to 20%, 15% to 25%, 50%-75% or greater than 0% to 95%. In one non-limiting embodiment of the invention the window 300 (see FIG. 18) is reduced by 100 milliseconds and 100 milliseconds of cell 304 is added onto the bar of the moveable window. Sliding the windows provides a more complete sampling of the data points that make up the curve of FIG. 17. For example and not limiting to the invention, the wave form can have a portion that overlaps the end of one window and the beginning of the next adjacent window. When this occurs the wave form has one portion with a time count for one window and a portion of the wave form with time count for the next adjacent window. In this case, the sum of the two portions of the wave form does not provide the complete information regarding the wave form. Using the embodiment of the invention provides a complete picture of the wave form.

In another non-limiting example of the invention, all signals below the threshold set point 208 are ignored, and all the signals above the threshold set point 208 below a certain period of time (as an example 212 milliseconds) are ignored, and only those signals above the threshold set point and beyond a certain time range are observed to indicate arcing. The observation can include, but is not limited to mathematical operations or comparisons or other signal analysis. In another non-limiting embodiment of the invention the initial electronic fingerprint is a waveform and is subtracted from the real time electrical signal to determine if there is the difference between the two signals. The difference is acted on to determine if the difference is due to arcing (generally indicated by current values above a threshold set point, e.g. but not limited to the threshold set point 208 or to other factors that may have occurred.

As disclosed in U.S. Pat. Nos. 8,155,816 and 8,383,994, the windows of aircrafts, in particular the aircraft windshield can include more than one sensor. In one non-limited embodiment of the invention, when the window has more than one sensor, the performance of each sensor can be determined individually and fingerprinting can be applied to each sensor.

The invention is not limited to the embodiments of the invention presented and discussed above which are presented for illustration purposes only, and the scope of the invention is only limited by the scope of the following claims and any additional claims that are added to applications having direct or indirect lineage to this application.

What is claimed is:

1. A method of making an initial electronic fingerprint for an aircraft having an electric powered article, comprising:
   monitoring performance of the article to determine operating performance range of the article;
   operating the aircraft having the article connected thereto under normal flight conditions for a predetermined operating period of time;
   monitoring electrical signal of the aircraft during the predetermined operating period of time, the electrical signal comprising current passing through the aircraft electrical system including passing through the article;
   acting on data of the electric signal of the aircraft monitored during the predetermined operating period of time to generate the initial electronic fingerprint for the aircraft.

2. The method according to claim 1 comprising recording the initial electronic fingerprint of the aircraft in electronic memory.

3. The method according to claim 1 comprising establishing a fingerprint library to record selected data collected during the predetermined operating period of time.

4. The method according to claim 1 comprising after the predetermined operating period of time, continue operating the aircraft having the article under normal flight conditions and collecting data from the electrical signal of the aircraft operating under normal flight conditions after the predetermined operating period of time.

5. The method according to claim 4 comprising during the continue operating the aircraft having the article under normal flight conditions after the predetermined operating period of time, generating a real time electronic signal from the data collected after the predetermined operating period of time, wherein the real time electronic signal comprises the threshold electric set point and the predetermined count time of the initial electronic signal, and an intercepting time period generated from the data collected after the predetermined operating period of time hereinafter defined as a "second intercepting time period".

6. The method according to claim 5 wherein the initial electronic fingerprint is compared to the real time electronic signal, and the second intercepting time period is greater than the Intercepting time period of the initial electronic fingerprint and less than an action taking intercepting time period indicating that the article is operating outside the acceptable performance range.

7. The method according to claim 5 wherein the initial electronic fingerprint is compared to the real time electronic signal, and the second intercepting time period is greater than the intercepting time period of the initial electronic fingerprint and greater than an action taking intercepting time period indicating that the article is operating outside the acceptable performance range.

8. The method according to claim 7 wherein the article is an aircraft windshield having a heatable member to remove ice, snow and fog from outer surface of the windshield and the second intercepting time period being greater than the action taking intercepting time period is an Indication that the heatable member is operating outside acceptable limits, and taking action to prevent damage to the windshield.

9. The method according to claim 5 wherein the article is an aircraft windshield having a heatable member to remove ice, snow and fog from outer surface of the windshield and the threshold electric set point is one ampere, the predetermined count time period is 500 microseconds, and the intercepting time period during the predetermined count time period is 100 microseconds.

10. The method according to claim 1 wherein the predetermined count time period is defined as a cell, and end of the cell is end of the predetermined count time period, wherein the beginning of a second cell is a value within the first cell and ends at the end of the predetermined count time period within the second cell.

11. The method according to claim 1, wherein the initial electronic fingerprint comprises a threshold electric set point, a predetermined count time period, and an Intercepting time period during the predetermined count time period, wherein the Intercepting time period is amount of time curve of the electronic signal of the aircraft overlays the threshold electric set point.

12. A method of identifying electronic fingerprint of a vehicle, comprising:
using electronic equipment and methodology to monitor the flow of electric current through the vehicle including through an article of the vehicle to generate data indicating performance of the vehicle and article under normal flight conditions and indicating performance of the article under operating conditions.

13. The method according to claim 12 wherein collecting data under acceptable conditions is accomplished by testing the article to determine if it is operating within an acceptable performance range and operating the vehicle having the article operating within acceptable conditions for a predetermined period of time, wherein the data collected under acceptable conditions is formatted to provide an initial electronic fingerprint of the vehicle and the article, and collecting data under operating conditions is accomplished by operating the vehicle having the article after the predetermined period of time, wherein the data collected under operating conditions is formatted to provide a real time electronic signal of the vehicle and the article.

14. The method according to claim 13 wherein performance of the article is determined by comparing the initial electronic fingerprint and the real time electronic signal to one another.

15. The method according to claim 14 comprising electronic storing of selected portions of the collected data.

16. The method according to claim 14 wherein the vehicle is an aircraft, the article is an aircraft windshield having a heatable member to remove snow, ice and/or fog from outer surface of the windshield.

17. A method of monitoring performance of an article mounted in or on a vehicle comprising:
generating an initial electronic fingerprint of the vehicle having the article;
generating a real time electronic signal of the vehicle;
comparing the initial electronic fingerprint and the real time electronic signal to determine the difference between intercepting time period and second intercepting time period;
acting on the difference between the intercepting time period and the second intercepting time period to determine if the article is operating within or without predetermined limits, wherein
the generating an initial electronic fingerprint, the generating a real time electronic signal, the comparing and the acting are performed using electronic equipment.

18. The method according to claim 17, wherein the initial electronic fingerprint comprises a threshold electric set point, a predetermined count time period, and an intercepting time period during the predetermined count time period, wherein the Intercepting time period is amount of time curve of the electronic signal of the aircraft overlays the threshold electric set point, and
wherein the real time electronic signal comprising the threshold electric set point and the predetermined count time of the initial electronic finger print, and an intercepting time period generated from the data collected after the predetermined operating period of time hereinafter defined as a "second intercepting time period".

19. The method according to claim 18 wherein data collected to generate an initial electronic fingerprint and a real time electronic signal is electronic, and the Initial electronic fingerprint and the real time electronic signal are stored in an electronic library.

20. The method according to claim 19 wherein the vehicle is an aircraft and the article is a windshield having a heatable member.

21. The method according to claim 19 wherein the article includes at least one sensor selected from the group of a moisture sensor; a conductive coating temperature sensor; an arc sensor; an impact sensor and/or a rupture sensor.

22. The method according to claim 17 wherein the article is tested to determine if it is operating within acceptable range before the initial electronic fingerprint is generated.

* * * * *